(12) United States Patent
Chen et al.

(10) Patent No.: US 8,344,443 B2
(45) Date of Patent: Jan. 1, 2013

(54) SINGLE POLY NVM DEVICES AND ARRAYS

(75) Inventors: Weize Chen, Phoenix, AZ (US);
Richard J. De Souza, Tempe, AZ (US);
Xin Lin, Phoenix, AZ (US); Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1038 days.

(21) Appl. No.: 12/109,736

(22) Filed: Apr. 25, 2008

(65) Prior Publication Data

US 2009/0267127 A1    Oct. 29, 2009

(51) Int. Cl.
*H01L 29/788* (2006.01)
*H01L 27/115* (2006.01)
*H01L 21/8247* (2006.01)

(52) U.S. Cl. ..................... 257/318; 438/258
(58) Field of Classification Search ............... 257/314, 257/E29.345, 298, E29.3, 320, 319, 316, 257/315, 288, 213; 438/201, 200, 199, 197, 438/142
See application file for complete search history.

(56) References Cited

U.S. PATENT DOCUMENTS

| | | | |
|---|---|---|---|
| 6,617,637 B1 | 9/2003 | Hsu et al. | |
| 6,711,064 B2 | 3/2004 | Hsu et al. | |
| 2004/0121535 A1* | 6/2004 | Shen et al. | 438/257 |
| 2004/0196698 A1* | 10/2004 | Hsu et al. | 365/185.28 |
| 2006/0208306 A1* | 9/2006 | Peng et al. | 257/315 |
| 2007/0279987 A1* | 12/2007 | Fang et al. | 365/185.18 |
| 2008/0266959 A1* | 10/2008 | Haggag et al. | 365/185.11 |
| 2010/0157669 A1* | 6/2010 | Audzeyeu et al. | 365/185.1 |

* cited by examiner

*Primary Examiner* — Olik Chaudhuri
*Assistant Examiner* — Wilner Jean Baptiste
(74) *Attorney, Agent, or Firm* — Hamilton & Terrile, LLP; Michael Rocco Cannatti

(57) ABSTRACT

A single-poly non-volatile memory includes a PMOS select transistor (210) formed with a select gate (212), and P+ source and drain regions (211, 213) formed in a shared n-well region (240), a serially connected PMOS floating gate transistor (220) formed with part of a p-type floating gate layer (222) and P+ source and drain regions (221, 223) formed in the shared n-well region (240), and a coupling capacitor (230) formed over a p-well region (250) and connected to the PMOS floating gate transistor (220), where the coupling capacitor (230) includes a first capacitor plate formed with a second part of the p-type floating gate layer (222) and an underlying portion of the p-well region (250).

20 Claims, 5 Drawing Sheets ns, in which:

SINGLE POLY NVM DEVICES AND ARRAYS

BACKGROUND OF THE INVENTION

1. Field of the Invention

The present invention relates generally to the field of integrated circuit technology. In one aspect, the present invention relates to a circuit design and method for manufacturing a non-volatile memory device, such as an electrically erasable programmable read only memory (EEPROM) or other embedded flash memory devices.

2. Description of the Related Art

Non-volatile memory devices, such as EEPROM and flash memory, are used in computers and other electronic devices to store data and/or programming instructions that can be electrically erased and reprogrammed and that must be saved when power is removed. Embedded non-volatile memory (NVM) has become increasingly important in applications ranging from data and code storage to circuit trimming and customization. By embedding a non-volatile memory in a CMOS device, a single chip device can be manufactured and configured for a variety of applications. To combine non-volatile memory (such as flash EEPROM) into a standard CMOS process flow, additional processing steps (and associated costs) are typically added to the standard CMOS process in order to construct the additional device features (such as a floating gate or control gate) along with other system components. Some EEPROM fabrication techniques have been proposed which reduce the additional processing cost. For example, single poly EEPROM designs have been proposed which form the charge storage element (e.g., the floating gate of a MOSFET) with a single layer of polysilicon, and which form the control gate using a well that is junction-isolated from the substrate so that a bias voltage can be applied to the control gate when operating the NVM bitcell. However, single poly NVM designs typically have very large bitcells due to the requirement of electrical isolation between different wells, thereby increasing the total chip size, which translates into a cost increase for the integrated circuit. Other single poly NVM designs have been proposed to address the size concern, such as the single poly PMOS bitcell designs described in U.S. Pat. Nos. 6,617,637 and 6,711,064 in which PMOS bitcells are formed by connecting a PMOS select transistor in series with a floating gate transistor which serves as the charge storage element. To reduce the bitcell size, the PMOS bitcells described in these patents do not use a dedicated control gate to control the floating gate potential during bitcell operation, but instead add an extra ion implant step to form an erase gate that provides a mechanism to erase the memory bitcell using band to band tunneling of hot holes (as described in U.S. Pat. No. 6,617,637) or by using edge Fowler-Nordheim tunneling (as described in U.S. Pat. No. 6,711,064). Both approaches turn part of the floating gate into an N+ doped region, thereby destroying any data retention benefit of using a PMOS floating gate because the N+ portion of the floating gate in effect makes the bitcell look like an NMOS bitcell from the charge retention standpoint. In addition, the use of band-to-band tunneling of hot holes to erase the bitcell can damage the gate oxide, thereby reducing device reliability.

Accordingly, there is a need for an improved embedded NVM design and manufacturing methodology to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

Figure 1:
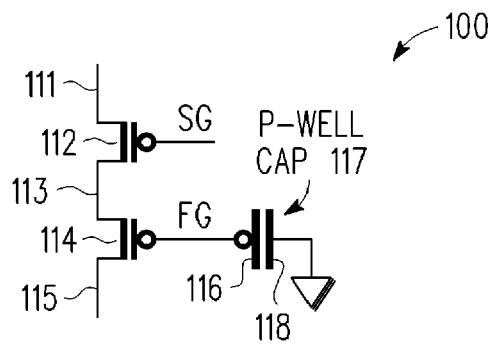
FIG. 1 depicts a circuit schematic representation of a compact PMOS nonvolatile memory bitcell in accordance with selected embodiments of the present invention.

A compact single-poly PMOS EEPROM bitcell and associated fabrication process are disclosed for providing an improved reliability, p-type doped floating gate layer which also forms a coupling capacitor over a p-well, where a single shared n-well is provided for each bitcell, thereby eliminating n-well to n-well spacing requirements within the bitcell while maintaining electrical program and erase capability. By reducing the area needed for electrical isolation between n-wells, the bitcell size is reduced in a way that allows bitcells to be efficiently configured in a memory array. For example, bitcell footprints below 10 square micrometers can be formed using existing CMOS processes. By forming a PMOS floating gate with a layer of all p-type material, the PMOS floating gate has improved reliability with good data retention properties due to the higher energy barrier seen by the stored electrons on the floating gate. Finally, by using the p-type floating gate and p-well to form a coupling capacitor, a Fowler-Nordheim tunneling mechanism may be used to erase charge from the floating gate while achieving competitive small bitcell footprint with only one shared n-well in each bitcell. The performance benefits and reduced size of the disclosed PMOS bitcell are provided without adding any process cost to a conventional CMOS process flow. In addition, the disclosed bitcell can be arranged in a memory array having a built-in mechanism for mitigating over-erasure and achieving better erase uniformity.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Referring now to FIG. 1, there is shown a circuit schematic representation of a compact PMOS nonvolatile memory bitcell 100 in accordance with selected embodiments of the present invention. As shown, the PMOS bitcell includes a PMOS select gate transistor 112, a PMOS floating gate transistor 114, and a p-well capacitor element 117 electrically coupled to the floating gate electrode of the PMOS floating gate transistor 114. The PMOS select transistor 112 is electrically connected through its gate to a word line (not explicitly shown), and is connected through its source 111 to a bit line in a common drain NOR embodiment or to a common source line for the memory block in a common source NOR embodiment, and is connected in series with the PMOS floating gate transistor 114. In turn, the PMOS floating gate transistor 114 is electrically connected through its gate to the capacitor element 117, and is connected in series with the PMOS select transistor 112 through the common source or drain 113. In a common drain NOR embodiment, the PMOS floating gate transistor 114 is connected to a common drain line for the memory block through its drain 115. In a common source NOR embodiment, it is connected to the bitline through its drain 115. Since both PMOS transistors 112, 114 are formed on the same n-type doped well (n-well), there is no requirement of any field oxide layer for isolating the PMOS structures from one another. While the PMOS select transistor 112 is shown as being connected on the source side of the PMOS floating gate 114, it will be appreciated that the PMOS select transistor 112 can also be placed at the drain side of the PMOS floating gate 114. However, this would require different bias combinations for bitcell operation.

As for the capacitor element 117, it is formed as a p-type poly/p-well capacitor over the p-type well (p-well) which may be used to electrically isolate two adjacent n-well regions. The top plate 116 of the capacitor element 117 is the p-type doped poly floating gate layer, which is the charge storage element. The bottom plate 118 of the capacitor element 117 is the p-well region. Where the p-well is electrically connected to the p-type substrate, then the bottom plate 118 of the capacitor element 117 is always grounded. However, in certain technologies where the p-well can be electrically isolated from the substrate (such as with an n-type substrate, a semiconductor on insulator (SOI) substrate, or when junction-isolated p-wells are used), the p-wells need not always be grounded. The capacitance of the p-type poly/p-well capacitor 117 is substantially larger than that of the floating gate transistor 114 so that the floating gate electrical potential is less sensitive to the biases on the source, drain, and well of the floating gate transistor 114 than to the p-well potential. This results from the fact that the coupling ratios of the source, drain, and channel in the floating gate transistor 114 are sufficiently small that the p-well coupling ratio is dominant (e.g., greater than 50%).

Figure 2:
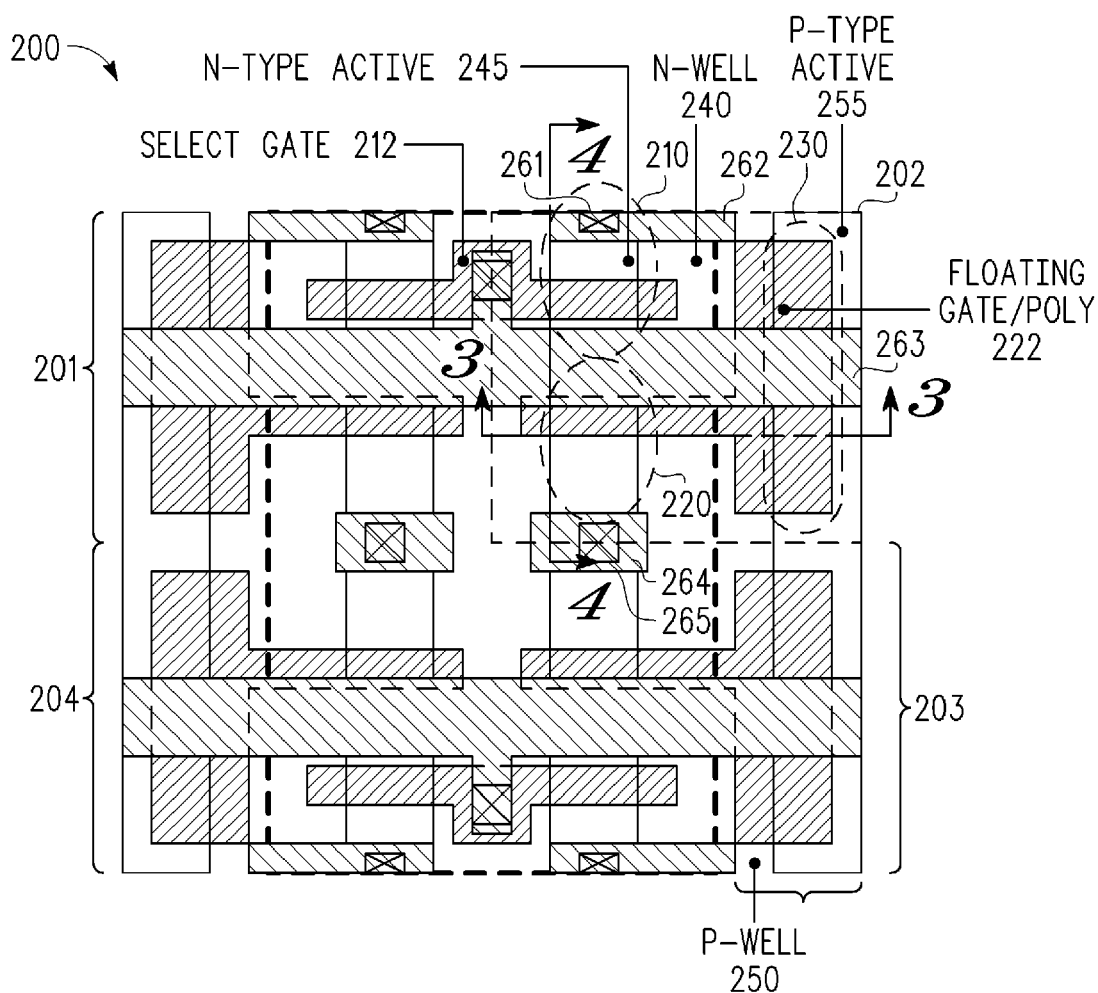
FIG. 2 depicts an example layout configuration of a PMOS bitcell with a p-type poly/p-well capacitor in accordance with selected embodiments of the present invention.

To illustrate selected examples of how PMOS NVM bitcells may be formed, reference is now made to FIG. 2 which depicts a plane view schematically illustrating an example layout configuration 200 of an array of PMOS bitcells 201-204 which each include a p-type poly/p-well capacitor in accordance with selected embodiments of the present invention. Each PMOS bitcell (e.g., 202) includes a PMOS select transistor 210, a capacitor element 230, and a PMOS floating gate transistor 220 connected between the PMOS select transistor 210 and the capacitor element 230. The PMOS transistors 210, 220 are formed on an n-well 240, while the capacitor element 230 is formed on a p-well 250. The PMOS select transistor 210 includes a select gate 212, a P+ doped source region formed in the n-type active area 245 at one side of the select gate 212, and a P+ doped drain region formed in the n-type active area 245 at the opposite side of the select gate 212. The PMOS floating gate transistor 220 includes a floating gate 222 which may be formed from a single layer of polysilicon, and there is no control electrode stacked thereon. The PMOS floating gate transistor 220 also includes a P+ doped source region formed in the n-type active area 245 at one side of the floating gate 222, and a P+ doped drain region formed in the n-type active area 245 at the opposite side of the floating gate 222. By forming the P+ doped drain region of the PMOS select transistor 210 and the P+ doped source region of the PMOS floating gate transistor 220 as a single, shared P+ doped region, the PMOS transistors 210, 220 are serially connected to each other. Finally, the capacitor element 230 includes a first capacitor plate that is formed by an extension of the floating gate/poly layer 222 over the p-well 250, and a second capacitor plate formed by a portion of an active region in the p-well 250.

With this configuration for the coupling capacitor element 230, the well over which the capacitor element 230 is formed can be part of the substrate 205, or may be isolated from the substrate 205 (e.g., using junction isolation or an SOI substrate), but it must be isolated from the adjacent wells on which the floating gate transistors are formed. Thus, the capacitor well (e.g., 250) and transistor well (e.g., 240) may both be formed with n-type or p-type semiconductor material, though in this case they must both be isolated from the substrate. Such isolation can be achieved by using an SOI substrate, or by forming the wells on a substrate of opposite dopant type or over a buried layer of opposite dopant type and using a deep trench in between the well to isolate them. The buried layer (or substrate of opposite dopant type) ensures that the capacitor well and transistor well are not shorted from underneath, and the deep trench ensures that they are not shorted laterally.

Figure 3:
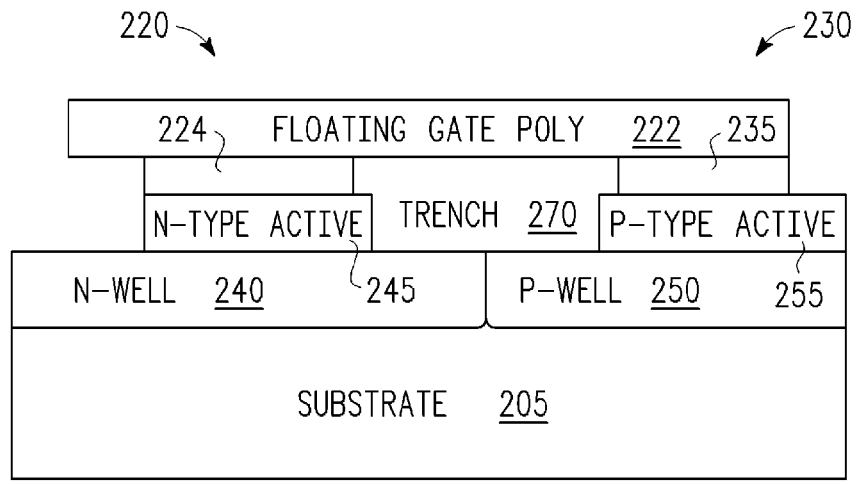
FIG. 3 depicts a first cross sectional representation of the single poly nonvolatile memory bitcell shown in FIG. 2.

For additional detail, reference is now made to FIG. 3 which depicts a first cross sectional representation of one of the single poly nonvolatile memory bitcells (e.g., 202) shown in FIG. 2 along the line labeled "FIG. 3." As depicted, the floating gate poly layer 222 is formed over the underlying p-type substrate 205 (and associated n-well and p-well regions 240, 250 with their corresponding active areas 245, 255), and extends from the n-well region (where the PMOS floating gate transistor 220 is formed), over a trench isolation region 270 to the p-well region 250 (where the capacitor element 230 is formed). In this way, the trench isolation region 270 electrically isolates the active channel region of the PMOS floating gate transistor 220 from the p-well active plate of the capacitor element 230. The depicted PMOS floating gate transistor 220 includes a floating gate dielectric layer 224 which is formed to a predetermined thickness (e.g., approximately 70 Angstroms) between the floating gate poly layer 222 and the active n-well substrate region 245. In addition, the capacitor element 230 includes a capacitive dielectric layer 235 formed to a predetermined thickness (e.g., approximately 70 Angstroms) between the floating gate poly layer 222 and the active p-well substrate region 255. Though the gate dielectric layer 224 and capacitive dielectric layer 235 are each shown as being a single layer, there may be a need for different dielectric thicknesses on the same semiconductor substrate or wafer, in which case a Dual Gate Oxide (DGO) process may be used to form the dielectric layers 224, 235 with different thicknesses.

Figure 4:
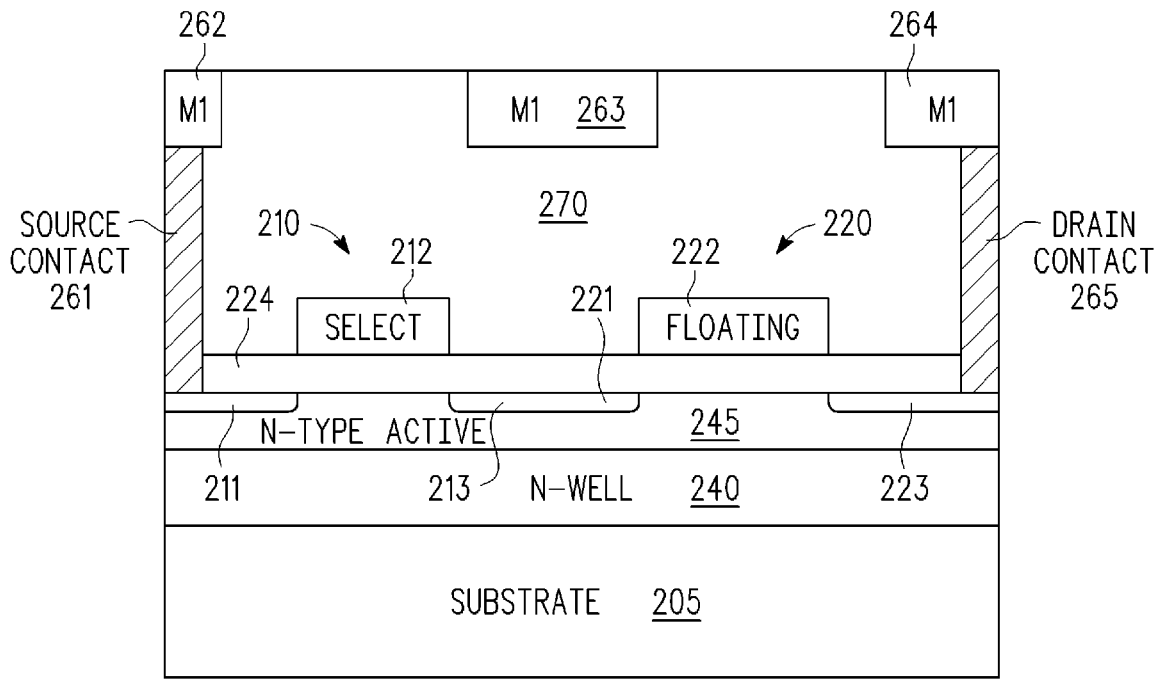
FIG. 4 depicts a second cross sectional representation of the single poly nonvolatile memory bitcell shown in FIG. 2.

FIG. 4 provides additional detail in depicting a second cross sectional representation of one of the single poly nonvolatile memory bitcells (e.g., 202) shown in FIG. 2 along the line labeled "FIG. 4." As depicted, the PMOS select transistor 210 and a PMOS floating gate transistor 220 are formed over the active area 245 in the n-well region 240 that is formed in the substrate 205. In particular, the PMOS select transistor 210 is formed from a polysilicon gate electrode 212, a gate dielectric layer 224 which is formed to a predetermined thickness (e.g., approximately 70 Angstroms), a P+ doped source region 211 formed in the active area 245 at one side of the select gate 212, and a P+ doped drain region 213 formed in the active area 245 at the opposite side of the select gate 212. The P+ doped source region 211 of the PMOS select transistor 210 is electrically connected with a bit line through a contact plug 261 and metal layer 262 formed in an inter layer dielectric (ILD) layer 270 for providing the PMOS NVM bitcell 202 with a bit line voltage in the common drain example embodiment. The bit line is typically defined, along with other metal conductors (e.g., metal line 263), over the dielectric film 270. While the select gate 212 is drawn on the source side of the floating gate 222, it will be appreciated that the select gate 212 can also be placed at the drain side of the floating gate 222.

As for the PMOS floating gate transistor 220, it is formed from a floating polysilicon gate electrode 222, a gate dielectric layer 224 formed to a predetermined thickness (e.g., approximately 70 Angstroms), a P+ doped source region 221 formed in the active area 245 at one side of the floating gate 222, and a P+ doped drain region 223 formed in the active area 245 at the opposite side of the floating gate 222. By forming the P+ doped drain region 213 of the PMOS select transistor 210 and the P+ doped source region 221 of the PMOS floating gate transistor 220 as a single, shared P+ doped region, the PMOS transistors 210, 220 are serially connected to each other. In the common drain configuration, the P+ doped drain region 223 of the PMOS floating gate transistor 220 is electrically connected with a common drain line through a contact plug 265 and metal layer 264 formed in an ILD layer 270 for providing the PMOS NVM bitcell 202 with a drain line voltage. Of course, in the common source configuration, the P+ doped source region of the select gate would be connected to a common source line, and the drain of the floating gate would be connected to a bitline.

As shown in FIGS. 2-4, there are no n-type implant regions formed using the floating gate 222 as a mask since the source/drain regions 221, 223 forming the floating gate transistor 220 are both P+ doped regions. As a consequence, the floating gate poly 222 in the thin oxide areas is all p-type doped, which provides better data retention. This is the case for the standard Si CMOS with SiO2 technology used today, but with reduced data retention requirements, thicker oxide or with another material system, N-type doping might be acceptable.

As described herein, a benefit of having a single n-well region for each bitcell is that the n-well region can be shared among adjacent bitcells when placed in a memory array, resulting in a very compact bitcell layout. While FIG. 2 shows four symmetrically arranged bitcells (which form the smallest repeating unit that can be used to construct a memory array when repeated in both X- and Y-direction), it will be appreciated that the n-well can be shared with many more bitcells along the Y-direction. For example, using the four memory bitcells 201-204 shown in FIG. 2 as the repeating unit, memory arrays can be created from bitcells that can each be as small as 5 to 7 square micron in current production technology and even smaller in future. For medium to large arrays, contacts to the n-well regions 240 and p-well regions 250 may be added in the middle of the array to ensure the uniformity of well potentials during operation.

Figure 5:
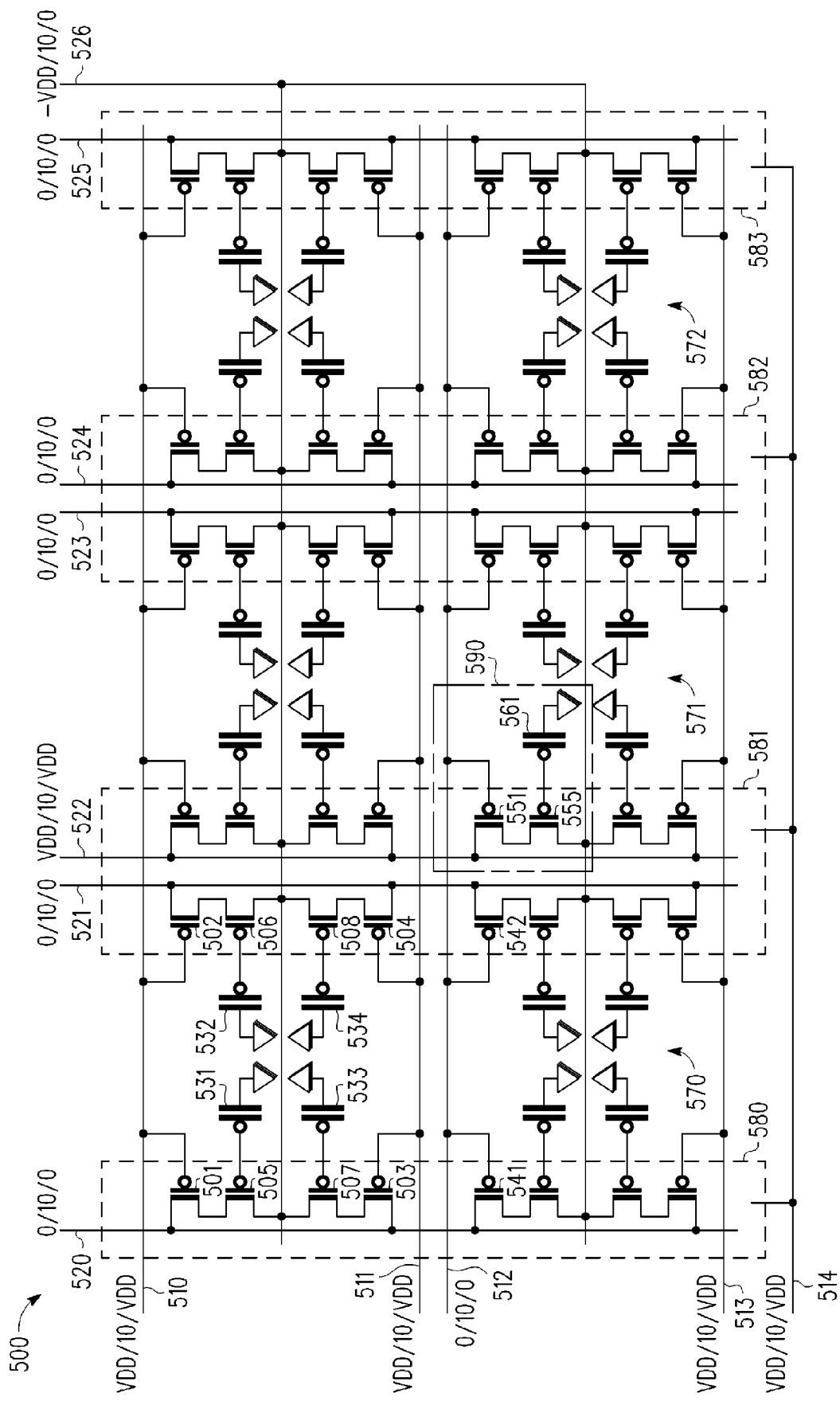
FIG. 5 depicts an example memory array architecture in accordance with a first exemplary common drain NOR embodiment.
Figure 6:
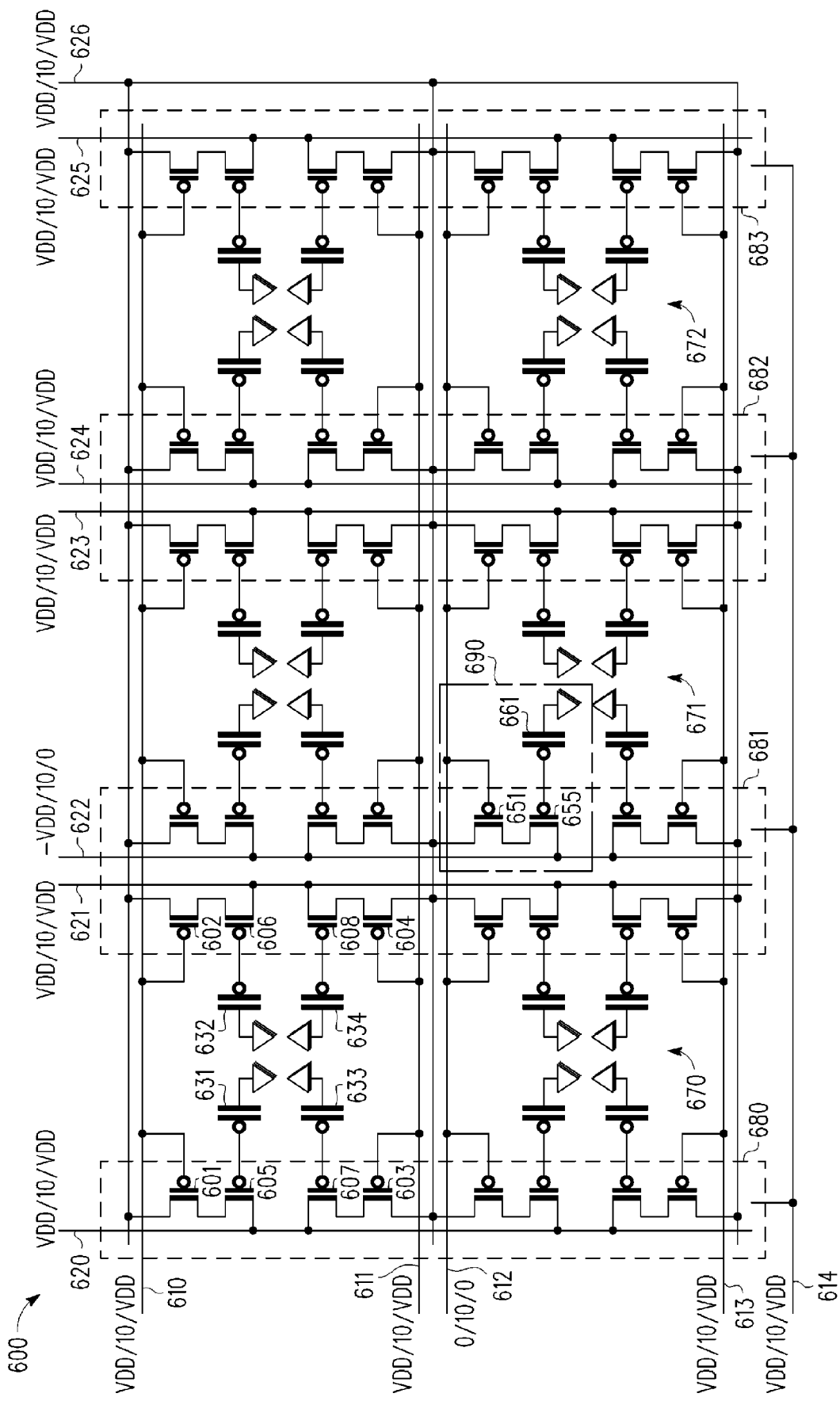
FIG. 6 depicts an example memory array architecture in accordance with a first exemplary common source NOR embodiment.

A first example memory array architecture is shown in FIG. 5 which depicts a common drain NOR architecture 500. In such an arrangement, the gates of the select transistors (e.g., 501-504) are connected into rows as the word lines (e.g., 510, 511), and the sources of the select transistors (e.g., 501-504) are connected into columns as the bit lines (e.g., 520, 521). In addition, all the drains of the floating gate transistors (e.g., 505-508) in the same block are connected together 526, and each of the gates of the floating gate transistors (e.g., 505-508) individually extend from the n-well region into the p-well region to form the capacitor elements (e.g., 531-534) in combination with the p-well substrate region (e.g., 570). Finally, the select transistors and floating gate transistors are all formed within the n-wells 580-583 which may be connected together 514. Another example memory array architecture is shown in FIG. 6 which depicts a common source NOR architecture 600. In this arrangement, each word line (e.g., 610) consists of multiple select gates (e.g., 601, 602) connected along the horizontal direction. However, the drains of the floating gate transistors (e.g., 605, 607) are connected along the vertical direction into columns to form the bit lines (e.g., 620). The sources of all the select transistors (e.g., 601-604) are connected together 626. Finally, the select transistors and floating gate transistors are all formed within the n-wells 680-683 which may be connected together 614. In both example architectures, the routing of the NVM arrays typically requires two layers of metal for highest possible density. This allows the memory array to be partitioned into several blocks, depending on the requirement of applications, where each block can be programmed and erased independently. The array architectures of FIGS. 5 and 6 represent two examples of the many different ways in which these bitcells could be connected to create an array.

With the depicted common drain NOR array 500 shown in FIG. 5, the program, erase and read operations will now be described with reference to an example set of biasing conditions which are indicated in FIG. 5 with the three numeric values adjacent to each column and row, where the first numeric value is the program bias voltage, the second numeric value is the erase bias voltage, and the third numeric value is the read bias voltage. For the following description of the memory array operations, it is assumed that the NVM array 500 is fabricated using a gate oxide of approximately 70 Angstrom thickness and a p-type substrate in which n-well and p-well regions are formed such that the p-wells are not isolated from the p-type substrate, and therefore are always grounded. As will be appreciated, other bias schemes are possible if the p-wells are electrically isolated from the substrate. However, there is no need to manipulate the bias at the second capacitor plate during read, program and erase operations.

To program a selected bitcell (e.g., 590), a positive bias (e.g., Vdd) is applied to the selected bit line 522, to all of the n-well regions 580-583 via bias line 514, and to all unselected word lines (e.g., 510, 511, 513). The selected word line (e.g., 512) and all unselected bit lines (e.g., 520, 521, 523, 524, 525) are held at ground, while a negative voltage (e.g., −Vdd) is applied to the common drain 526. Under such bias conditions, the select transistors of all unselected bits are turned OFF as they see a gate to source voltage Vgs of 0V. However, the select transistor 551 of the selected bit 590 is fully turned ON, and a potential of nearly 2 Vdd is dropped between the source and drain of the floating gate transistor 555 of the selected bit 590, creating a high lateral electric field across the channel region of the floating gate transistor. Since the p-type poly/p-well capacitor (e.g., 561) has a dominant coupling ratio and its bottom plate (the p-well 571) is always grounded, only a small amount of the biases on the source, drain, and n-well of the floating gate transistor 555 will be coupled onto the floating gate. If the floating gate does not contain a significant amount of positive charge, the potential of the floating gate will be substantially lower than the biases applied on the source and the n-well, which is Vdd. Therefore, floating gate transistor 555 is turned ON. Holes will be accelerated by the large lateral electric field towards the space charge region of the drain junction, where energetic holes will cause impact ionizations, creating electron-hole pairs. Some of the created electrons have sufficient kinetic energy to overcome the potential barrier of the gate oxide and be injected onto the floating gate. This is the program operation which puts electrons onto the floating gate. When more and more electrons are injected onto the floating gate, the floating gate potential becomes more negative, which creates a vertical electric field that suppresses the further injection of electrons into the floating gate. Thus, the program operation of the bitcell 590 is self-limiting. The program operation does not disturb the unselected bits because the select transistors of all the unselected bits are turned OFF during programming of the selected bitcell 590. In this way, it is possible to control the select gate bias such that an optimum amount of current flows through the bitcell, achieving the best program efficiency, while at the same time minimizing the power consumption. A multiple of bits on the same word line can be programmed at the same time if so desired.

To perform an erase operation, the entire block is erased at one time by using the Fowler-Nordheim tunneling mechanism uniformly across the entire channel of the floating gate, thereby reducing oxide damage effects and providing better reliability as compared to other erase mechanisms that use a smaller tunneling area. During an erase operation, all the n-wells 580-583, the common drain 526, and all the word lines 510-513 and bit lines 520-525 within a memory block will be simultaneously biased to a same high voltage (e.g., 10V). Under this bias condition, the oxide field in the select gate area is at a minimum since its gate, source, drain, and n-well are all biased at the same potential. However, because the bottom plates 570-572 of the p-type poly/p-well capacitors are always grounded, the floating gate potential is significantly lower than that of the channel area. For the programmed bits where there are net negative charges on the floating gate, the surface of the p-well in the p-type poly/p-well capacitor is in accumulation, and the capacitance of the p-type poly/p-well capacitor is near its maximum, resulting in a highest coupling ratio for the capacitor and the lowest coupling ratios for the source, drain, and channel area. As a result of the negative charges on the floating gate and the highest p-type poly/p-well capacitor coupling ratio, the floating gate potential is near its lowest value, meaning that a large vertical field across the gate oxide of the floating gate transistor is created which causes electrons to tunnel out of the floating gate. This is the uniform channel erase operation using the Fowler-Nordheim tunneling mechanism. As the erase operation progresses, the net amount of electrons on the floating gate decreases and the floating gate potential rises. When there are net positive charges on the floating gate, the surface of the p-well in the p-type poly/p-well capacitor is driven into depletion, and the channel regions of the floating gate transistor are in accumulation. As a result, the coupling ratio of the p-type poly/p-well capacitor decreases and the coupling ratios of the source, drain, and channel area increase, resulting in a further increase of the floating gate potential. Therefore, the electric field across the gate oxide of the floating gate transistor decreases, slowing down the tunneling of electrons out of the floating gate and the erase operation approaches saturation. In such a scenario, the depletion of the p-well surface in the p-type poly/p-well capacitor near the end of erase operation causes the coupling ratios to change favorably, which helps to prevent over erasure and achieve a more uniform erase operation across the entire memory array.

During a read operation for a bitcell (e.g., 590), the n-wells 580-583, the selected bit line 522, and all the unselected word lines (e.g., 510, 511, 513) are raised to Vdd, while the selected word line (e.g., 512) and the common drain 526 are grounded. As a result, the select transistors on all unselected word lines are turned OFF, and only the select transistors (e.g., 541, 542, 551, etc.) on the selected word line 512 are turned on. The charge state of the floating gate 555 in the selected bit determines the amount of current flowing through the selected bit line 522. If the floating gate is in the program state and its potential is negative enough (i.e., it contains net negative charges), the floating gate transistor 555 is strongly turned ON so a large current will flow through the selected bit line. On the other hand, if the floating gate is in the erase state with sufficient decrease in negative potential (i.e., there is enough increase in net positive charges on the floating gate), the channel conductance of the floating gate transistor 555 is low, and there is only a small current flowing through the selected bit line 522. Alternatively, the bias of the selected bit line 522 can be reduced to a fraction of Vdd that is just enough to turn ON the select transistor. This will reduce the gate to source voltage Vgs, and create a back bias on the floating gate. As a result, an erased bit can completely turn OFF the channel, while a programmed bit can still conduct current.

For the common source architecture depicted in FIG. 6, the underlying physical mechanisms of program and erase operations are the same as those for the common drain architecture of FIG. 5, but the bias conditions differ. To program, the selected bit line (e.g., 622) is pulled down to −Vdd and the selected word line (e.g., 612) is grounded. The n-well regions 680-683, the common source 626, all the unselected bit lines (620, 621, 623, 624, 625) and word lines (610, 611, 613) are pulled up to Vdd. To erase, all the word lines 610-613, bit lines 620-625, n-well regions 680-683, and common source 626 are raised to a same high potential (e.g., 10V). During read operations, the selected word line (e.g., 612) and selected bit line (e.g., 622) are grounded, while all the unselected word lines and unselected bit lines, the n-wells, and the common source 626 are pulled up to Vdd. Similar to the case of common drain architecture, the voltage applied to the common source 626 can be reduced such that the select transistor of the selected bit just turns ON, but an erased bit will completely turn OFF the channel of the floating gate.

As described herein, the erase operations for both the common source and common drain embodiments may be implemented by applying the same high voltage (e.g., 10V) to the n-wells, the common drain (or common source), and all the word lines and bit lines within a memory block will be simultaneously biased to a same high voltage (e.g., 10V). With this bias condition, the select transistor gate, source, drain, and n-well are all biased at the same potential. However, other erase bias conditions can be used in accordance with selected embodiments of the present invention. For example, during erase operations, the select gates can be biased at a gate bias potential that is lower (up to one Vdd lower) than the bias voltage applied to the source, drain and n-well. With these differing bias conditions, the select gate will see a vertical field which is safe for the oxide thickness that is used in the select gate transistor. While the differing bias condition scheme increases the number of voltages that are needed to operate the bitcell, it advantageously inverts the channel under the select gate so that the voltage applied to the source of the select gate transistor can easily propagate to the drain of the select gate transistor.

A benefit of the common drain architecture is that there is only one common node that needs a negative voltage supply. However, all the drain junctions within the same memory block will see 2 Vdd reverse bias during program operations. With the common source architecture, on the other hand, such reverse bias is only applied to the selected column during program operations. However, the negative voltage supply needs to be made available to every column. Shorting the n-wells together is beneficial because it allows maximum density. However, other n-well connection schemes may allow lower power consumption and increased biasing flexibility at the expense of more routing overhead.

Figure 7:
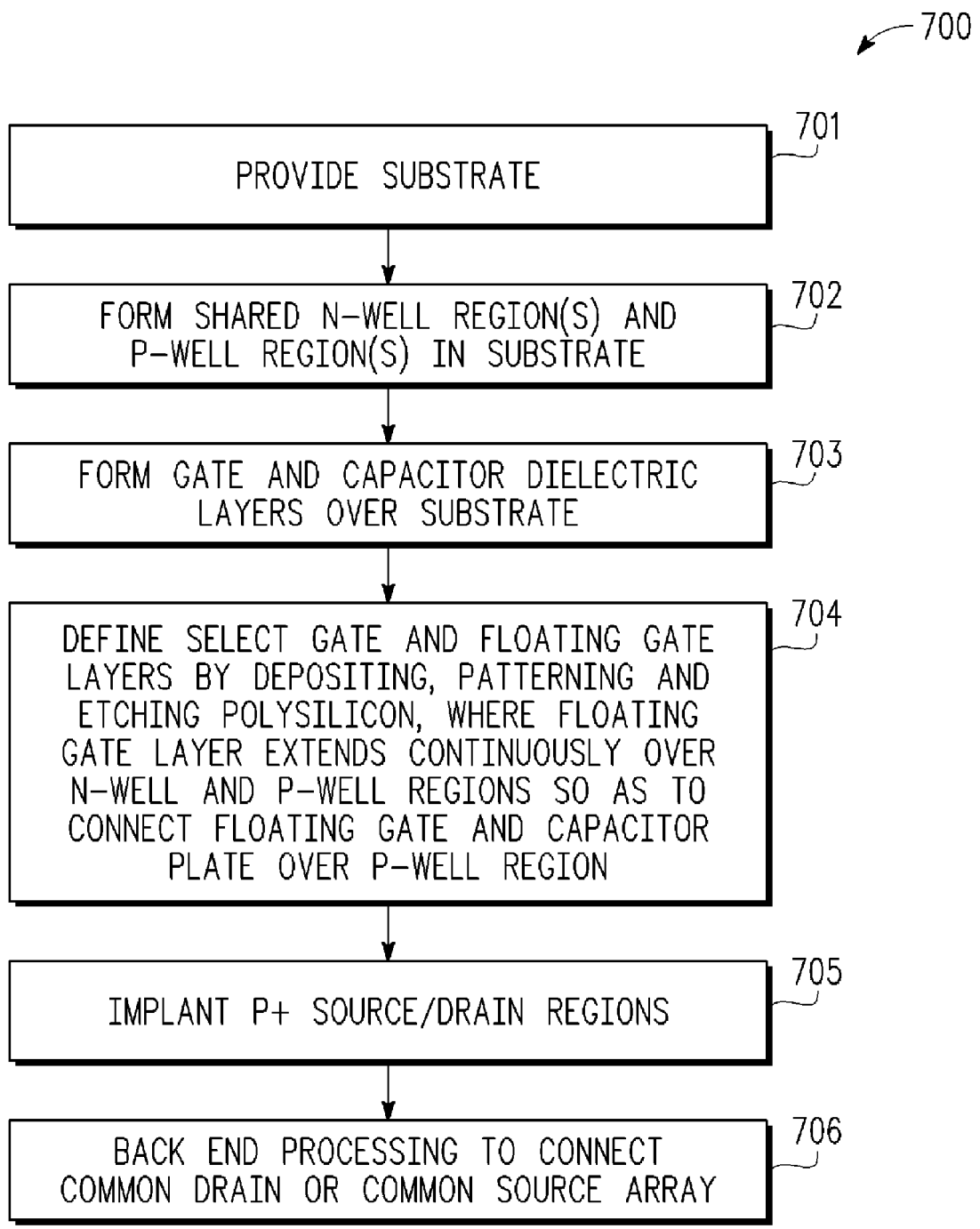
FIG. 7 illustrates a simplified process flow for fabricating an array of single poly NVM devices.

Turning now to FIG. 7, there is depicted a simplified process flow 700 for fabricating an array of single poly NVM devices which each includes a PMOS bitcell with a p-type poly/p-well capacitor. The depicted process is used to fabricate a compact PMOS NVM bitcell and memory array that requires zero added processing to conventional CMOS process flow. As a preliminary step 701, a substrate is provided, such as a p-type substrate, an n-type substrate with p-type wells, an SOI substrate, bulk silicon substrate, epi silicon, SiGe substrate, etc. In the substrate, n-well and p-well regions are formed at step 702 using any desired technique, such as source diffusion, implantation and annealing, etc. The placement and location of the n-wells and p-wells conforms to the final location of the bitcell transistor and capacitor components, respectively. As will be appreciated, the formation of n-wells and p-wells may use existing CMOS processing technology steps, such as diffusion, implantation, annealing, etc.

At step 703, one or more dielectric layers are formed for subsequent use as the gate dielectric layers and capacitor dielectric layers. The dielectric layers may be formed with any desired technique (e.g., deposition, thermal oxidation, DGO, etc.) with any desired dielectric material (e.g., silicon dioxide or a high-k or medium-k dielectric material, such as a metal oxide (MeOx)). Again, the formation of dielectric layers may use conventional CMOS processing technology steps, such as deposition or growth of dielectric layers.

At step 704, the select gate and floating gate layers are defined by depositing, patterning, and etching a layer of polysilicon, again using any desired pattern and etch process for selectively etching the polysilicon layer in the desired pattern or shape. The polysilicon layer may be doped as a p-type material prior to etching by diffusing or implanting p-type impurities. In addition or in the alternative, the poly layer may be doped as p-type after etching, such as by implanting p-type impurities during formation of the source/drain regions. It will be appreciated that the formation of select and floating gates may use existing CMOS processing technology processes, such as poly deposition, photoresist patterning, and selective etching, though applied in a way so that the floating gate layer, as finally formed, is defined to extend continuously over the n-well and p-well regions so as to connect the floating gate and capacitor plate over p-well region. While most CMOS processes use polysilicon gates, metal-based gate electrodes may also be used, along with more exotic processing, like selective deposition/epitaxy or direct beam writing.

With the defined select and floating gates in place, the P+ source and drain regions for the bitcell transistors are formed at step 705. To perform the implantation step, a mask is used to protect other parts of the semiconductor structure from the P+ implants, and one or more sidewall spacers may also be used as implant masks by forming and anisotropically etching a mask layer (e.g., silicon dioxide or nitride) to form spacers on the sidewalls of the defined select and floating gates. Again, the selective implantation of P+ source/drain regions may use existing CMOS processing technology processes, such as masking and implanting processes.

Finally, one or more back end processing steps are applied (step 706) to connect the PMOS NVM bitcell in a common drain or common source array, such as described hereinabove. These back end processing steps may use existing CMOS processing technology processes, such as depositing ILD layers, selectively masking the ILD layers to form contact openings, and forming conductive contact plugs and metal layers to connect the bitcell transistors to the external circuitry for programming, erasing and reading operations.

By now it should be appreciated that there has been provided a single-poly non-volatile memory device (e.g., an EEPROM) and method for compactly forming same over a substrate. In selected embodiments, the disclosed memory device includes a PMOS select transistor having a select gate formed over a select gate dielectric layer, and P+ source and drain regions formed in a shared n-well region of the substrate. The memory device also includes a PMOS floating gate transistor that is serially connected to the PMOS select transistor, where the PMOS floating gate transistor includes part of a p-type floating gate layer formed over a floating gate dielectric layer, and P+ source and drain regions formed in the shared n-well region of the substrate. As formed, the select gate of the PMOS select transistor may be drawn on the source side or the drain side of the PMOS floating gate transistor. The formed PMOS floating gate transistor is a single-gate transistor without any control gate formed above the first part of the p-type floating gate layer. The serial connection may be implemented by electrically connecting or merging the P+ source region of the PMOS floating gate transistor with the P+ drain region of the PMOS select transistor. Finally, the memory device includes a coupling capacitor that is formed over a p-well region of the substrate and that is connected to the PMOS floating gate transistor. The coupling capacitor includes a first capacitor plate formed with a part of the p-type floating gate layer, a capacitor dielectric layer, and a second capacitor plate formed with an underlying portion of the p-well region. To connect the coupling capacitor and floating gate transistor, the p-type floating gate layer is formed by defining a p-type doped layer of polysilicon that extends as a continuous conductive layer over the shared n-well region and the p-well region, thereby forming the floating gate and the first capacitor plate. However, an isolation region may also be formed in an upper region of the substrate to electrically isolate one or more active regions in the n-well region from one or more active regions in the p-well region. With this configuration, charge on the a p-type floating gate layer may be erased using a Fowler-Nordheim tunneling mechanism by applying a first relatively high voltage to the shared n-well region, the select gate, the P+ source region of the PMOS select transistor, and the P+ drain region of the PMOS floating gate transistor while the p-well region is grounded. Alternatively, the floating gate charge may be erased using a Fowler-Nordheim tunneling mechanism by grounding the p-well region while applying a first relatively high voltage to the shared n-well region, the P+ source region of the PMOS select transistor, and the P+ drain region of the PMOS floating gate transistor and applying a second voltage to the select gate, where the second voltage is up to one Vdd voltage lower than the first relatively high voltage. The NVM device may be combined in an array with additional single-poly NVM devices which each includes an additional PMOS select transistor and serially connected PMOS floating gate transistor formed on the shared n-well region of the substrate (where the additional PMOS floating gate transistor includes a first part of a p-type floating gate layer), and an additional coupling capacitor formed over the p-well region of the substrate to include a first additional capacitor plate formed with a second part of the p-type floating gate layer, an additional capacitor dielectric layer, and a second additional capacitor plate formed with an underlying portion of the p-well region. For example, the single-poly non-volatile memory device may be connected in a common drain NOR array configuration by connecting the P+ drain region of the PMOS floating gate transistor in common with other P+ drain regions from other PMOS floating gate transistors. Alternatively, the single-poly non-volatile memory device may be connected in a common source NOR array configuration by connecting the P+ source region of the PMOS select transistor in common with other P+ source regions from other PMOS select transistors.

In another form, there is provided a single-poly non-volatile memory device (e.g., an EEPROM) and method for compactly forming same. In selected embodiments, the memory device includes a floating gate transistor coupled through its gate to a coupling capacitor. The floating gate transistor may be implemented as a predetermined conductivity type of transistor (e.g., NMOS or PMOS) that includes a floating gate formed over a floating gate dielectric layer from a first part of a floating gate layer, and source and drain regions formed adjacent to the floating gate in a first shared well region. The coupling capacitor is formed over a second shared well region that is isolated from the first shared well region. As formed, the coupling capacitor includes a first capacitor plate formed with a second part of the floating gate layer so as to be connected to the floating gate transistor, a capacitor dielectric layer, and a second capacitor plate formed with an underlying portion of the second shared well region. The second capacitor plate can be held at the same predetermined potential (e.g., ground) during read, programming, and erasing operations. In selected embodiments, the coupling capacitor is formed over a p-well (or n-well) region of an underlying substrate (e.g., bulk or bulk with buried layers or SOI substrate), and includes a first capacitor plate formed with a second part of the floating gate layer (which may be p-type or n-type), a capacitor dielectric layer, and a second capacitor plate formed with an underlying portion of the p-well (or n-well) region. Regardless of the conductivity type of the materials used to form the capacitor well and transistor well, the wells should be electrically isolated from one another so that the capacitor well can be maintained at a constant or fixed bias while allowing the transistor well to be biased as desired for bitcell operations. For example, the coupling capacitor may be formed over the second shared well region of the first predetermined conductivity, and where the second shared well region is electrically isolated from the first shared well region by an underlying semiconductor layer of a second predetermined conductivity type that is opposite to the first predetermined conductivity type and by one or more adjacent deep trench regions. The memory device may also include a select gate transistor (e.g., either PMOS or NMOS) that is serially connected to the floating gate transistor through a shared source/drain region in the first shared well region, where the select transistor includes a select gate formed over a select gate dielectric layer, and source and drain regions formed adjacent to the select gate in the first shared well region. With this arrangement, the select transistor and floating gate transistor can both be PMOS transistors formed in a shared n-well region, or NMOS transistors formed in a shared p-well region.

In yet another form, there is provided a single-poly non-volatile memory device and method for compactly forming same. As disclosed, a semiconductor substrate structure is provided, and a shared n-well region and p-well region are formed therein. After forming one or more dielectric layers over the semiconductor substrate structure to cover at least part of the shared n-well region and p-well region, a polysilicon layer is formed (e.g., deposited) over the dielectric layers, where the poly layer is doped p-type during or after forming the polysilicon layer. Thereafter, the polysilicon layer is patterned and etched to define a PMOS select gate and a PMOS floating gate over the shared n-well region, and to define a first coupling capacitor plate over the p-well region. As defined, the PMOS floating gate and coupling capacitor plate are formed from a single continuous polysilicon conductor that extends from the shared n-well region to cover at least part of the p-well region, thereby defining a second coupling capacitor plate in a portion of the p-well region underlying the polysilicon conductor. Subsequently, a PMOS select transistor and PMOS floating gate transistor are formed in the shared n-well region by implanting P+ source and drain regions in the shared n-well region of the semiconductor substrate structure substantially adjacent to the PMOS select gate and PMOS floating gate. As formed, the PMOS select transistor is serially connected to the PMOS floating gate transistor through a shared source or drain region, and the PMOS floating gate is directly connected through the continuous polysilicon conductor to the first coupling capacitor plate.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the select gate and floating gate layers may be defined with different shapes and relative dimensions than shown in the layout plot of FIG. 2. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A single-poly non-volatile memory device formed over a substrate, comprising:
    a PMOS select transistor comprising a select gate formed over a select gate dielectric layer, and P+ source and drain regions formed in a shared n-well region of the substrate;
    a PMOS floating gate transistor serially connected to the PMOS select transistor, where the PMOS floating gate transistor comprises a first part of a p-type floating gate layer formed over a floating gate dielectric layer, and P+ source and drain regions formed in the shared n-well region of the substrate; and
    a coupling capacitor formed over a p-well region of the substrate and connected to the PMOS floating gate transistor, comprising a first capacitor plate formed with a second part of the p-type floating gate layer, a capacitor dielectric layer, and a second capacitor plate formed with an underlying portion of the p-well region.

2. The single-poly non-volatile memory device of claim 1, where the P+ source region of the PMOS floating gate transistor is electrically connected to the P+ drain region of the PMOS select transistor.

3. The single-poly non-volatile memory device of claim 1, where the p-type floating gate layer comprises a layer of p-type doped polysilicon that extends as a continuous conductive layer over the shared n-well region and the p-well region.

4. The single-poly non-volatile memory device of claim 1, where the single-poly non-volatile memory device comprises an electrically erasable programmable read only memory bitcell.

5. The single-poly non-volatile memory device of claim 1, where the PMOS floating gate transistor is a single-gate transistor without any control gate formed above the first part of the p-type floating gate layer.

6. The single-poly non-volatile memory device of claim 1, comprising an isolation region formed in an upper region of the substrate to electrically isolate one or more active regions in the n-well region from one or more active regions in the p-well region.

7. The single-poly non-volatile memory device of claim 1, further comprising additional single-poly non-volatile memory devices formed over the substrate in an array, where each additional single-poly non-volatile memory device comprises:
    an additional PMOS select transistor formed on the shared n-well region of the substrate;
    an additional PMOS floating gate transistor serially connected to the additional PMOS select transistor and formed on the shared n-well region of the substrate, where the additional PMOS floating gate transistor comprises a first part of a p-type floating gate layer; and
    an additional coupling capacitor formed over the p-well region of the substrate, comprising a first additional capacitor plate formed with a second part of the p-type floating gate layer, an additional capacitor dielectric layer, and an second additional capacitor plate formed with underlying portion of the p-well region.

8. The single-poly non-volatile memory device of claim 1, where charge on the p-type floating gate layer is erased using tunneling by applying a first relatively high voltage to the shared n-well region, the select gate, the P+ source region of the PMOS select transistor, and the P+ drain region of the PMOS floating gate transistor while the p-well region is grounded.

9. The single-poly non-volatile memory device of claim 1, where charge on the p-type floating gate layer is erased using tunneling by grounding the p-well region while applying a first relatively high voltage to the shared n-well region, the P+ source region of the PMOS select transistor, and the P+ drain region of the PMOS floating gate transistor and applying a second voltage to the select gate, where the second voltage is up to one Vdd voltage lower than the first relatively high voltage.

10. The single-poly non-volatile memory device of claim 1, where the P+ drain region of the PMOS floating gate transistor is connected in common with P+ drain regions from other PMOS floating gate transistors in a common drain NOR array.

11. The single-poly non-volatile memory device of claim 1, where the P+ source region of the PMOS select transistor is connected in common with P+ source regions from other PMOS select transistors in a common source NOR array.

12. The single-poly non-volatile memory device of claim 1, where the select gate of the PMOS select transistor is drawn on a source side of the PMOS floating gate transistor.

13. The single-poly non-volatile memory device of claim 1, where the select gate of the PMOS select transistor is drawn on a drain side of the PMOS floating gate transistor.

14. A single-poly non-volatile memory device, comprising:
    a floating gate transistor of a first predetermined conductivity type, where the floating gate transistor comprises a floating gate formed over a floating gate dielectric layer from a first part of a floating gate layer, and source and drain regions formed adjacent to the floating gate in a first well region;
    a select transistor serially connected to the floating gate transistor, where the select transistor comprises a select gate formed over a select gate dielectric layer, and source and drain regions formed adjacent to the select gate in the first well region; and
    a coupling capacitor formed over a second well region that is isolated from the first well region, comprising a first capacitor plate formed with a second part of the floating gate layer so as to be connected to the floating gate transistor, a capacitor dielectric layer, and a second capacitor plate formed with an underlying portion of the second well region.

15. The single-poly non-volatile memory device of claim 14, where the select transistor and floating gate transistor each comprise a PMOS transistor formed in the first well region that is an n-well region.

16. The single-poly non-volatile memory device of claim 14, where the select transistor and floating gate transistor each comprise an NMOS transistor formed in the first well region that is a shared p-well region.

17. The single-poly non-volatile memory device of claim 14, where the floating gate layer comprises a p-type floating gate layer, and where the coupling capacitor is formed over a p-well region of an underlying substrate and comprises a first capacitor plate formed with a second part of the p-type floating gate layer, a capacitor dielectric layer, and a second capacitor plate formed with an underlying portion of the p-well region.

18. The single-poly non-volatile memory device of claim 14, where the coupling capacitor is formed over an n-well region of an underlying substrate and comprises a first capacitor plate formed with a second part of the floating gate layer, a capacitor dielectric layer, and a second capacitor plate formed with an underlying portion of the n-well region.

19. The single-poly non-volatile memory device of claim 14, where the coupling capacitor is formed over the second well region of the first predetermined conductivity, and where the second well region is electrically isolated from the first well region by an underlying semiconductor layer of a second predetermined conductivity type that is opposite to the first predetermined conductivity type.

20. A method for forming a single-poly non-volatile memory device, comprising:
  providing a semiconductor substrate structure;
  forming a shared n-well region in the semiconductor substrate structure;
  forming a p-well region in the semiconductor substrate structure that is isolated from the shared n-well region;
  forming one or more dielectric layers over the semiconductor substrate structure to cover at least part of the shared n-well region and p-well region;
  forming a polysilicon layer over the one or more dielectric layers which is doped p-type during or after forming the polysilicon layer;
  patterning and etching the polysilicon layer to define a PMOS select gate and a PMOS floating gate over the shared n-well region, and to define a first coupling capacitor plate over the p-well region, where the PMOS floating gate and coupling capacitor plate are formed from a single continuous polysilicon conductor that extends from the shared n-well region to cover at least part of the p-well region, thereby defining a second coupling capacitor plate in a portion of the p-well region underlying the polysilicon conductor; and
  forming a PMOS select transistor and PMOS floating gate transistor in the shared n-well region by implanting P+ source and drain regions in the shared n-well region of the semiconductor substrate structure substantially adjacent to the PMOS select gate and PMOS floating gate, such that the PMOS select transistor is serially connected to the PMOS floating gate transistor through a shared source or drain region, and the PMOS floating gate is directly connected through the continuous polysilicon conductor to the first coupling capacitor plate.

* * * * *